(12) United States Patent
Lew et al.

(10) Patent No.: US 8,303,711 B2
(45) Date of Patent: *Nov. 6, 2012

(54) ELECTRODE ANCHORING STRUCTURE IN CRYSTAL-GROWING FURNACES

(75) Inventors: Shiow-Jeng Lew, Taipei (TW); Hur-Lon Lin, Taipei (TW)

(73) Assignee: Green Energy Technology Inc. (TW)

( * ) Notice: Subject to any disclaimer, the term of this patent is extended or adjusted under 35 U.S.C. 154(b) by 1135 days.

This patent is subject to a terminal disclaimer.

(21) Appl. No.: 12/219,709

(22) Filed: Jul. 28, 2008

(65) Prior Publication Data

US 2009/0211519 A1 Aug. 27, 2009

(30) Foreign Application Priority Data

Feb. 21, 2008 (TW) .............................. 97106083 A

(51) Int. Cl.
*C30B 15/00* (2006.01)
*C30B 21/06* (2006.01)
*C30B 27/02* (2006.01)
*C30B 28/10* (2006.01)
*C30B 30/04* (2006.01)

(52) U.S. Cl. ............... 117/217; 117/215; 248/188.7; 248/635; 373/128; 373/129

(58) Field of Classification Search .................. 117/217; 373/130
See application file for complete search history.

(56) References Cited

U.S. PATENT DOCUMENTS

| | | | | | |
|---|---|---|---|---|---|
| 1,933,527 | A | * | 10/1933 | Wadman | 373/31 |
| 3,004,090 | A | * | 10/1961 | Donovan et al. | 373/110 |
| 3,395,241 | A | * | 7/1968 | Roman | 373/128 |
| 5,414,927 | A | * | 5/1995 | Fiel et al. | 373/110 |
| 7,971,836 | B2 | * | 7/2011 | Lew et al. | 117/217 |
| 2009/0173275 | A1 | * | 7/2009 | Lew et al. | 117/200 |
| 2009/0175767 | A1 | * | 7/2009 | Lew et al. | 422/109 |
| 2009/0188426 | A1 | * | 7/2009 | Lew et al. | 117/206 |

* cited by examiner

*Primary Examiner* — Melvin C Mayes
*Assistant Examiner* — Ross J Christie
(74) *Attorney, Agent, or Firm* — Bacon & Thomas, PLLC

(57) ABSTRACT

An electrode anchoring structure in a crystal-growing furnace includes at least one graphite electrode pillar, at least one metal electrode pillar, at least one anchoring base, and at least one locking nut, wherein the graphite electrode pillar is engaged with a nut base of the metal electrode pillar, and the at least one metal electrode pillar is, through the anchoring base, is secured to furnace wall. Therefore, the at least one graphite electrode pillar acts both as weight support and electrical-conducting electrode. Since the flange welded on furnace wall has a greater area exposed to the atmosphere, a desirable cooling effect can be achieved, and temperature drop can be expedited if water spray is performed. The anchoring base is provided with a resilient washer, such that a resilient force can be employed to adjust loading of each graphite electrode pillar in an axial direction.

14 Claims, 7 Drawing Sheets

ELECTRODE ANCHORING STRUCTURE IN CRYSTAL-GROWING FURNACES

BACKGROUND OF THE INVENTION

1. Field of the Invention

The present invention relates to a structure for anchoring electrodes, more particularly, to a structure adapted for anchoring electrodes in crystal-growing furnaces.

2. Description of Related Art

Referring to FIG. 1, a schematic view illustrating a prior art, a conventional crystal-growing furnace, a heating room 91 is arranged inside the crystal-growing furnace 9, wherein heaters 912 are disposed inside the heating room 91 and around a crucible 911 so as to heat silicon slurry contained in the crucible 911. Electrical power is supplied to the heaters 912 through electrodes 92 which are connected with from outside the furnace. Since the electrodes 92 are made of metal and cannot sustain extremely high temperature condition in the furnace 9, cooling water 923 needs to be continuously introduced through a water-feeding pipe 921, then circulates and recycles through an exhaust pipe 922. The heat brought out through the cooling water 923 is taken care of by a chiller. The cooling water 923 must be of pure water and is replenished by a water purifier. Conventionally, since equipment for making the pure water, as well as the chiller, is indispensable, and since it is impossible to stop running these facilities, cost for crystal production significantly increases.

Further, since the furnace 9 runs at a semi-vacuum state, in case slits occur on walls of the electrodes 92 due to a long-time use or manufacture defects, particularly in case the electrodes 92 fracture due to discontinuity of cooling water supply, the cooling water 923 will be sucked into the furnace 9. As a result, the cooling water 923, the silicon slurry, and graphite facilities in the heating room 91 will be reacted fiercely in the furnace 9 at high temperature, and a great amount of hydrogen ($H_2$), carbon monoxide (CO) and steam will be released. The pressure inside the furnace 9 will increase abruptly, and thus the furnace 9 blows off, causing a hydrogen explosion, and becomes an accident on public security.

SUMMARY OF THE INVENTION

The present invention is to provide an electrode anchoring structure in a crystal-growing furnace, comprising a graphite electrode pillar, a metal electrode pillar, an anchoring base, and a locking nut.

According to the present invention, the graphite electrode pillar is, at one end, provided with an external thread. The metal electrode pillar includes a nut base and an external screw. The nut base is, at one end, provided with an internal thread hole so as to be engaged with the external thread of the graphite electrode pillar. The nut base extends, from its other end, the external screw, such that a shoulder is formed between the nut base and the external screw.

The anchoring base includes a flange, an insulating sleeve, an insulating pad, a sealing washer, a fixing ring, a plurality of insulating rings and of bolts.

Further, according to the present invention, the flange includes a cylindrical portion and an annular portion, wherein the cylindrical portion has a central hollow portion and the annular portion has a plurality of through holes. The insulating sleeve receives the nut base of the metal electrode pillar, and which are then received together in the central hollow portion. The insulating pad has a center through hole, and there are plural circular holes provided around the insulating pad. The sealing washer is provided with a center hole, and there are plural releasing holes provided around the sealing washer.

The external screw of the metal electrode pillar extends through the center hole of the sealing washer and a central hole of a resilient washer, such that the shoulder abuts upon the sealing washer. The fixing ring is provided, circumferentially, with a plurality of fixing holes.

The plural bolts extend, correspondingly, through the plural fixing holes of the fixing ring, the plural insulating rings, plural holes of the resilient washer, the plural releasing holes of the sealing washer, the plural circular holes of the insulating pad, and the plural through holes of the flange, and are engaged tightly with plural nuts so as to secure together the insulating pad, the sealing washer and the resilient washer in between the flange and the fixing ring. The flange and the sealing washer are electrically insulated from each other because they are spaced apart by the insulating sleeve, the insulating pad, and the plural insulating rings.

The locking nut is engaged with the external screw of the metal electrode pillar so as to secure the sealing washer and the resilient washer in between the locking nut and the shoulder of the metal electrode pillar.

Further, according to the present invention, the graphite electrode pillar is, at other end, electrically connected with a heater arranged inside the furnace. The graphite electrode pillar is, at the other end, provided with an external thread, and that the heater inside the furnace is provided with an upper nut and a lower nut, where the upper and the lower nuts of the heater are engaged with the external thread such that an electrical connection can be established, correspondingly.

According to the present invention, the electrode anchoring structure in a crystal-growing furnace, as mentioned above, comprises plural graphite electrode pillars which act both as weight supports and electrical-conducting electrodes. Besides, the same-type electrode anchoring structures can be commonly used in heaters so as to reduce the spare parts stock. Since the flange welded on the wall of the furnace has a greater area exposed to the atmosphere, a desirable cooling effect can be achieved, and that temperature drop can be expedited if water spray is performed. Due to a desirable effect on heat-resistance and cooling for the electrode anchoring structure, according to the present invention, there is no need to induct pure water into electrodes for cooling. Therefore, not only cost can be saved, but also accidents on public security due to water leakage can be prevented.

The graphite electrode pillar further includes an upper adjusting nut and a lower adjusting nut, and through engagement of the adjusting nuts with the external thread of the graphiteelectrode pillar, so that a table plate can be put on it, a heater in the furnace can be supported According to the present invention, both the upper adjusting nut and the lower adjusting nut are made of graphite. An insulating cap is provided for covering the upper adjusting nut. The metal electrode pillar refers to a copper electrode pillar, and an external screw of which is, at one end, electrically connected with an outside electric power source, such as threadingly engaged with a cable so as to provide electric power to the heater in the furnace. Further, the anchoring base includes the resilient washer interposed between the sealing washer and the fixing ring, such that a resilient force in an axial direction can be employed to adjust bearing of loading for each graphite electrode pillar in the axial direction and so to make the graphite electrode pillar bear a uniform loading. The resilient washer has a center portion, an annular portion, and at least one resilient portion, wherein the at least one resilient portion is located in between the center portion and the annular portion, and wherein the center portion is provided with a central hole, and the annular portion provided with a plurality of holes.

The flange is provided with an annular protrusion, and that the insulating pad with an annular recess, such that the annular protrusion can be inserted into the annular recess. This will result in an anchoring action, such that no sliding will occur between the flange and the insulating pad.

An external edge is provided, circumferentially, at the insulating pad so as to be sealingly engaged with the flange and to enhance an insulating effect. The sealing washer is made of copper.

Further, according to the present invention, the electrode anchoring structure in a crystal-growing furnace may include a plurality of insulating seats and a plurality of insulating caps covering, respectively, on heads the plural bolts, or on the plural nuts, so as to prevent water from passing through gaps among the bolts, and to achieve a desirable insulation.

Other objects, advantages, and novel features of the present invention will become more apparent from the following detailed description when taken in conjunction with the accompanying drawings.

DETAILED DESCRIPTION OF THE PREFERRED EMBODIMENTS

Figure 1:
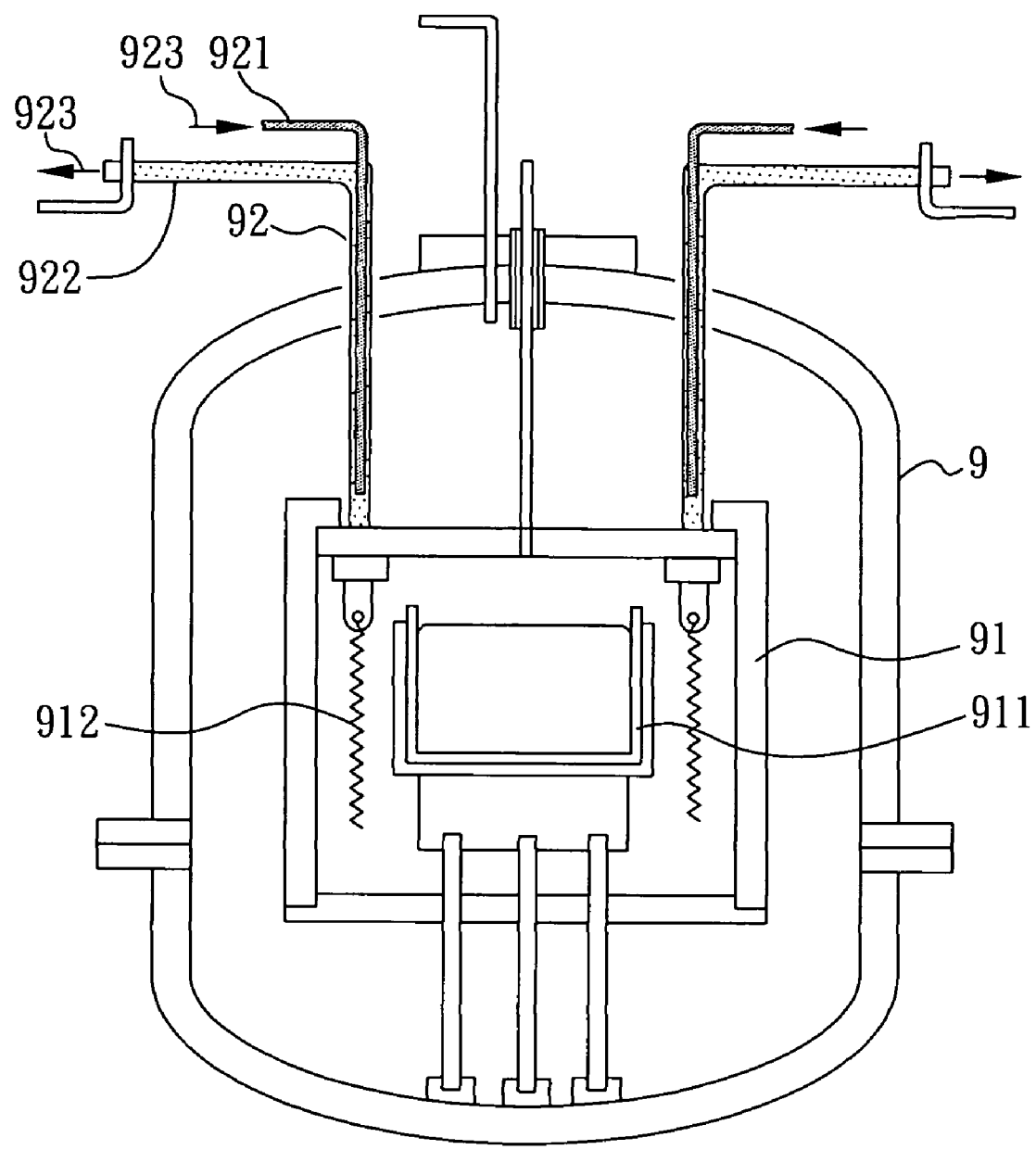
FIG. 1 is a schematic view illustrating a conventional crystal-growing furnace.
Figure 2:
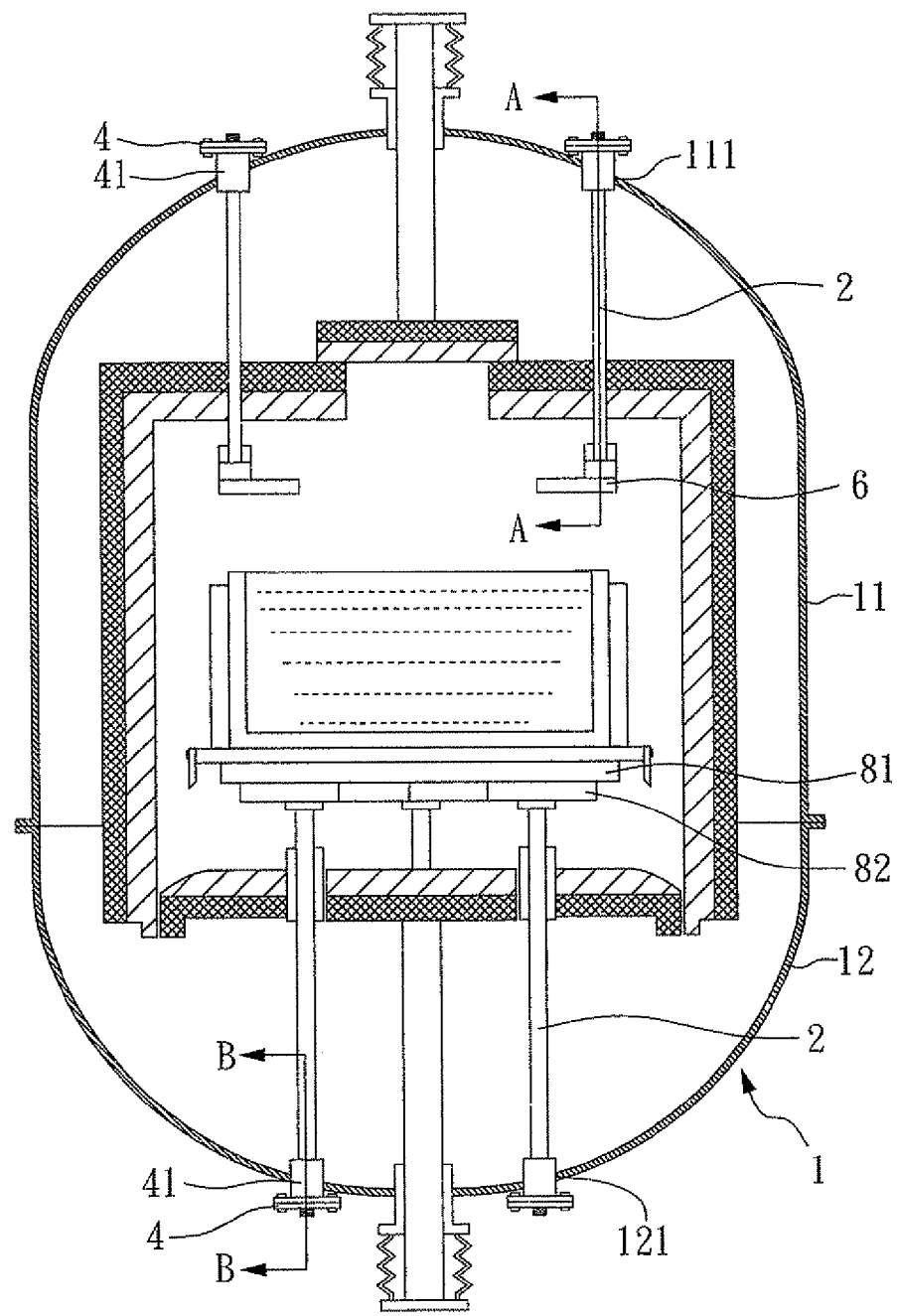
FIG. 2 is a cross-sectional view illustrating a crystal-growing furnace according to the present invention.

Referring to FIG. 2, a cross-sectional view illustrating a crystal-growing furnace according to the present invention, an electrode anchoring structure is secured inside of mounting holes 111 provided at an upper body 11 of the furnace, and inside of mounting holes 121 at a lower body 12 of the furnace 1, respectively.

Figure 3:
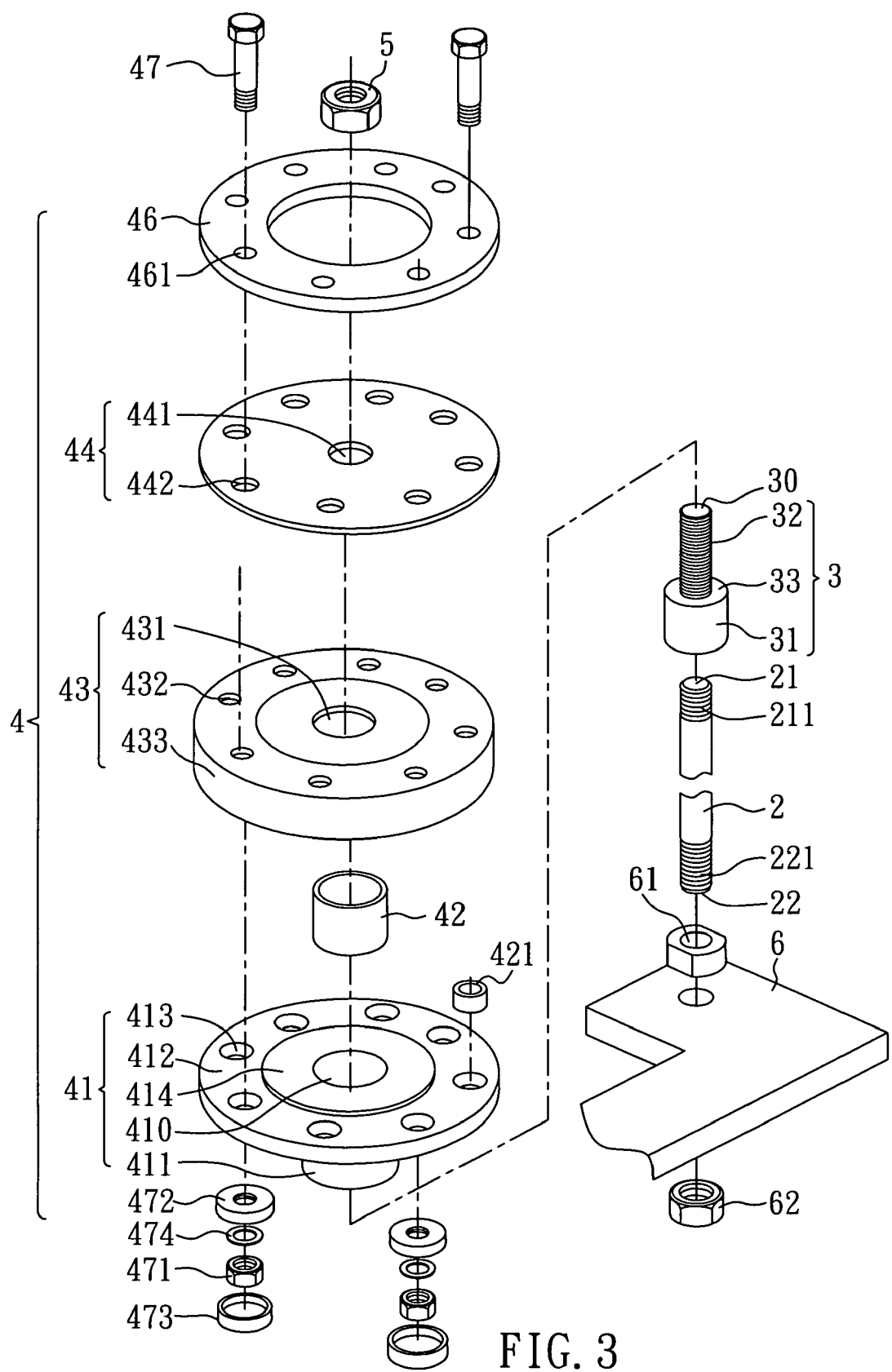
FIG. 3 is an exploded view illustrating an electrode anchoring structure in the crystal-growing furnace according to a first embodiment of the present invention.
Figure 4:
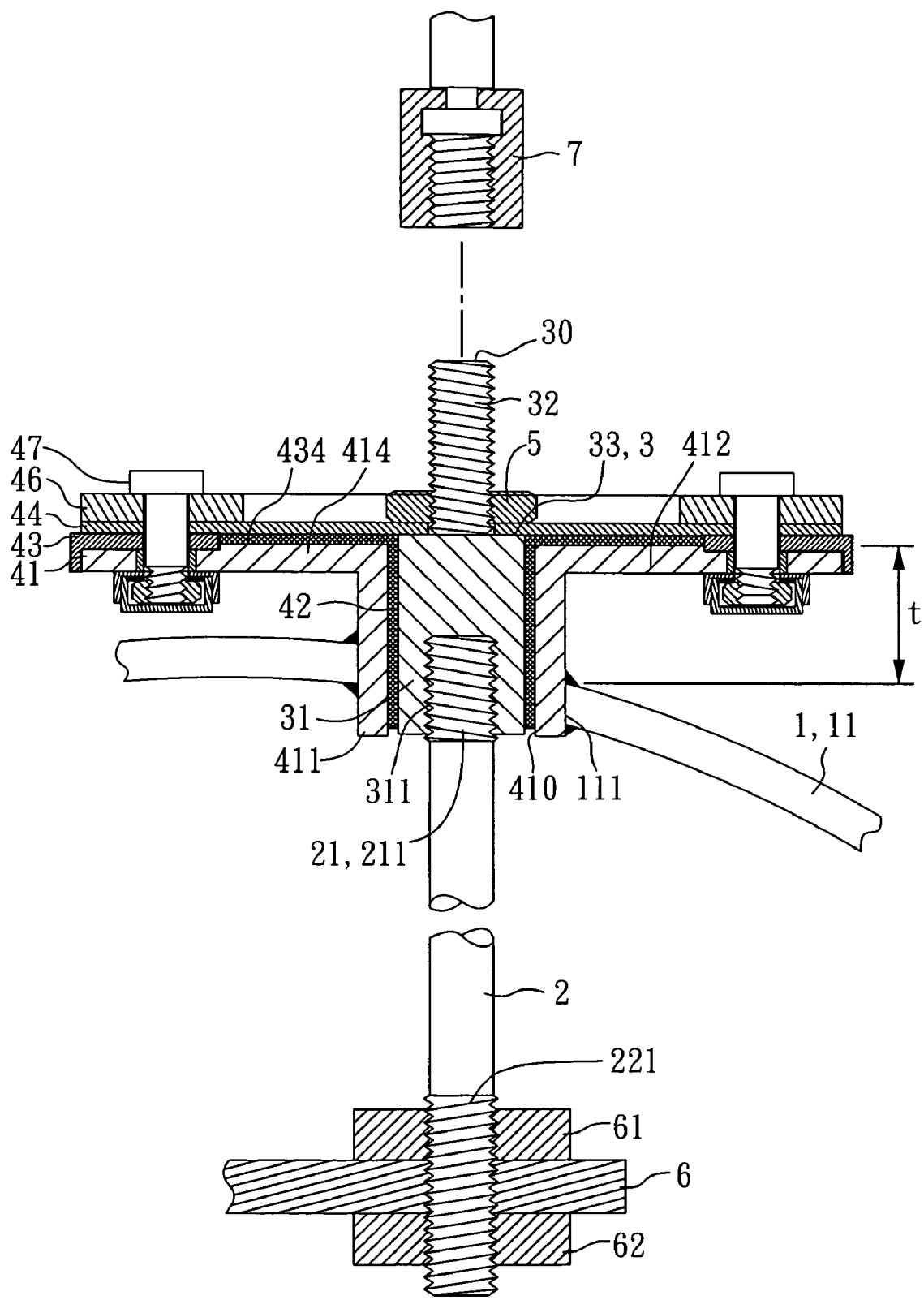
FIG. 4 is a cross-sectional view illustrating the electrode anchoring structure according to the first embodiment of the present invention.

Further, referring to FIGS. 3 and 4, an exploded and a cross-sectional views illustrating an electrode anchoring structure in the crystal-growing furnace according to a first embodiment of the present invention, the electrode anchoring structure comprises a graphite electrode pillar 2, a metal electrode pillar 3, an anchoring base 4, and a locking nut 5.

The graphite electrode pillar 2 is, at one end 21, provided with an external thread 211. The metal electrode pillar 3 is a copper electrode pillar, and includes a nut base 31 and an external screw 32. The nut base 31 is, at one end, provided with an internal thread hole 311 so as to be engaged with the external thread 211 of the graphite electrode pillar 2. The nut base 31 extends, from other end, the external screw 32, where a shoulder 33 is formed between the nut base 31 and the external screw 32. The external screw 32 of the metal electrode pillar 3 is, at an external end 30, electrically connected with an outside electric power source, such as threadingly engaged with a cable 7 (see FIG. 4) so as to provide electric power to heaters arranged in the furnace.

As shown in FIG. 3, the anchoring base 4 includes a flange 41, an insulating sleeve 42, an insulating pad 43, a sealing washer 44, a fixing ring 46, and eight bolts 47.

Now referring to FIGS. 2, 3 and 4, the flange 41 refers to a stainless flange including a cylindrical portion 411 and an annular portion 412, wherein the cylindrical portion 411 is, circumferentially, welded to the inside of the mounting holes 111,121 provided at the upper body 11 or the lower body 12 of the furnace 1, such that the annular portion 412 spaces apart from wall of the furnace 1 an appropriate distance t. The cylindrical portion 411 has a central hollow portion 410, and that the annular portion 412 is provided with eight through holes 413. The insulating sleeve 42 refers to an alumina-fiber sleeve which receives the nut base 31 of the metal electrode pillar 3, and which are then received together in the central hollow portion 410.

Further, the insulating pad 43 refers to a silicon rubber or Teflon washer having a center through hole 431, where there are eight circular holes 432 provided around the insulating pad 43, and where an external edge 433 is provided, circumferentially, at the insulating pad 43, such that the insulating pad 43 can be sealingly engaged with the flange 41 so as to enhance an insulating effect.

As shown in FIGS. 3 and 4, the flange 41 is provided with an annular protrusion 414, and that the insulating pad 43 with an annular recess 434, such that the annular protrusion 414 can be inserted into the annular recess 434. This will result in an anchoring action, such that no sliding will occur between the flange 41 and the insulating pad 43.

The sealing washer 44 is made of copper, and includes a center hole 441 and eight releasing holes 442 therearound. The external screw 32 of the metal electrode pillar 3 extends through the center hole 441 of the sealing washer 44, such that the shoulder 33 presses upon the sealing washer 44.

The fixing ring 46 is provided, circumferentially, with eight fixing holes 461. The eight bolts 47 extend, correspondingly, through the eight fixing holes 461, the eight releasing holes 442, the eight circular holes 432, eight insulating rings 421, the eight through holes 413, eight insulating seats 472, and eight washers 474, and are engaged tightly with eight nuts 471 so as to secure together the insulating pad 43 and the sealing washer 44 in between the flange 41 and the fixing ring 46. The flange 41 and the sealing washer 44 are electrically insulated from each other because they are spaced apart by the insulating sleeve 42, the insulating pad 43, and the eight insulating rings 421. Thereafter, eight insulating caps 473 are provided for enveloping heads of the eight bolts 47, respectively, so as to prevent water from passing through gaps of the bolts 47, and to enhance insulating effect.

As shown in FIG. 4, the locking nut 5 is engaged with the external screw 32 of the metal electrode pillar 3 so as to secure the sealing washer 44 in between the locking nut 5 and the shoulder 33 of the metal electrode pillar 3.

As shown in FIG. 3, the graphite electrode pillar 2 is, at other end 22, electrically connected with a heater 6 arranged inside the furnace 1. Since the graphite electrode pillar 2 is, at the other end 22, provided with an external thread 221, together with arrangement of an upper nut 61 and a lower nut 62, and since the heater 6 is secured by the upper and the lower nuts 61,62, an electrical connection can be established, correspondingly.

It is understood that since the electrode anchoring structure, according to the present invention, has a desirable effect either on heat-resistance or on cooling, there is no need for the electrodes to be cooled by pure water. This will surely not only reduce cost, but also prevent cooling water from leaking, where such leakage might result in accidents on public security.

Figure 5:
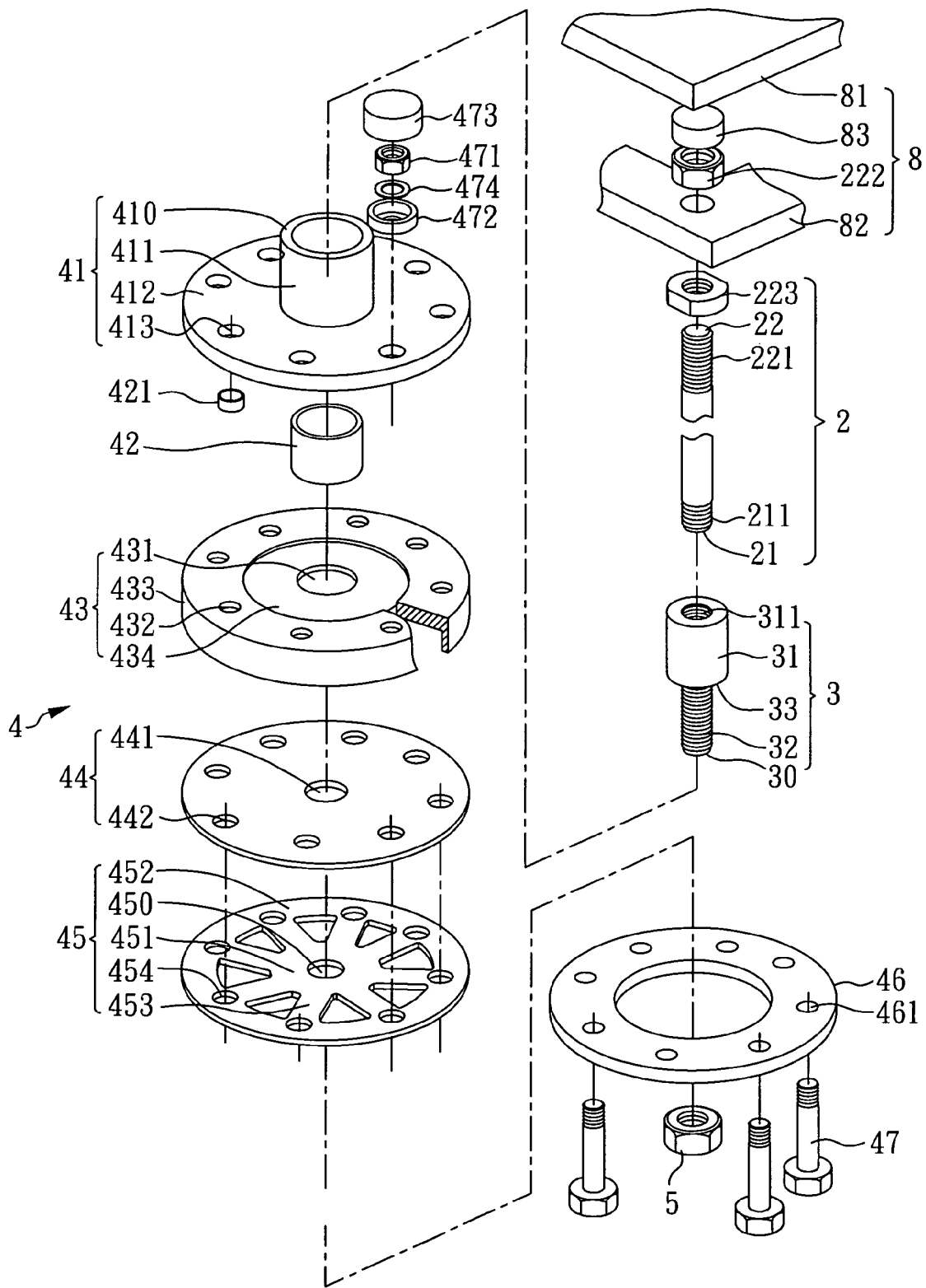
FIG. 5 is an exploded view illustrating an electrode anchoring structure according to a second embodiment of the present invention.
Figure 6:
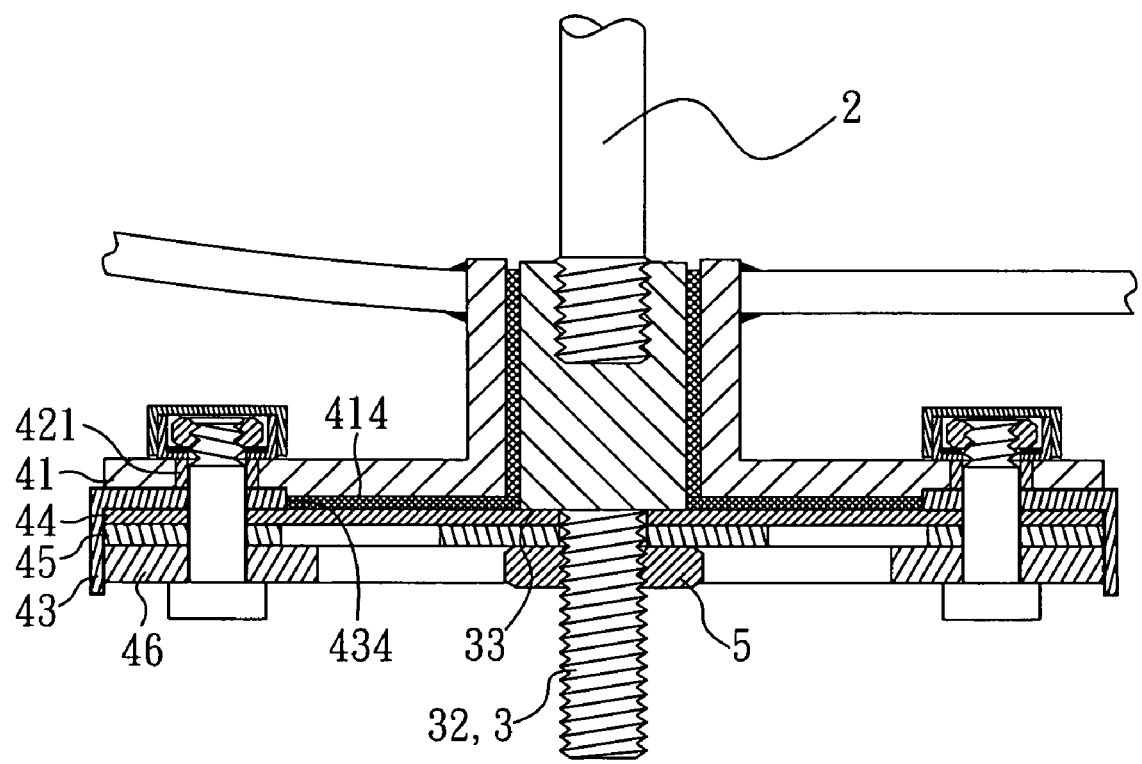
FIG. 6 is a cross-sectional view illustrating the electrode anchoring structure according to the second embodiment of the present invention.

Now referring to FIGS. 5 and 6, an exploded view illustrating an electrode anchoring structure according to a second embodiment of the present invention and a cross-sectional view illustrating the electrode anchoring structure, the second embodiment has a structure similar to that of the first embodiment, except that a resilient washer 45 and an insulating cap 83 are installed. The graphite electrode pillar 2, according to the second embodiment, further includes an upper adjusting nut 222 and a lower adjusting nut 223 which are made of graphite. Through engagement of the upper and the lower adjusting nuts 222,223 with the external thread 221 of the graphite electrode pillar 2, a supporting table 8 is supported and positioned such that height of a table plate 81, which is arranged horizontally, can be adjusted. An insulating cap 83 is provided for covering the upper adjusting nut 222 for electrical insulation to the table plate 81.

Unlike the first embodiment, in the second embodiment, the anchoring base 4 also includes a resilient washer 45 having a center portion 451, an annular portion 452, and eight resilient portions 453. The resilient portions 453 are located in between the center portion 451 and the annular portion 452, where the resilient portions 453 are located in between the center portion 451 and the annular portion 452, where the center portion 451 is provided with a central hole 450, and the annular portion 452 with eight holes 454.

As shown in FIG. 5, the eight bolts 47 extend, correspondingly, through the eight fixing holes 461, the eight holes 454, the eight releasing holes 442, the eight circular holes 432, the eight insulating rings 421, the eight through holes 413, the eight insulating seats 472, and the eight washers 474, and are engaged tightly with the eight nuts 471 so as to secure together the insulating pad 43, the sealing washer 44 and the resilient washer 45 in between the flange 41 and the fixing ring 46. Thereafter, the eight insulating caps 473 are provided for enveloping heads of the eight bolts 47, respectively, so as to enhance insulating effect.

Further, referring to FIG. 6, the resilient washer 45 is interposed between the sealing washer 44 and the fixing ring 46, and that the locking nut 5 is threadedly engaged with the external screw 32 of the metal electrode pillar 3, such that the sealing washer 44 and the resilient washer 45 are secured in between the locking nut 5 and the shoulder 33 of the metal electrode pillar 3. As a result, a resilient force in an axial direction can be employed to adjust the graphite electrode pillar 2 to bear a uniform loading.

According to the present invention, the electrode anchoring structure in a crystal-growing furnace, as mentioned above, includes plural graphite electrode pillars 2 which act both as weight supports and electrical-conducting electrodes. Besides, the same-type electrode anchoring structures can be commonly used in the heaters 6,82 so as to reduce stock and make management convenient. That is to say, in case one of the heaters turns out to be damaged, parts of the same specification can be used for replacement. As such, maintenance becomes convenient, and labor and material cost are saved.

Still further, since the graphite electrode pillars 2 are disposed in the crystal-growing furnace 1, high temperature can be resisted; and since the flange 41 welded on the wall of the furnace has a greater area exposed to the atmosphere, a desirable cooling effect can be achieved. Temperature drop can be expedited, if water is sprayed on the external surface of the anchoring base 4. Because there is no need to induct pure water into the electrodes for cooling, accidents on public security due to water leakage can be prevented. In addition, since the resilient washer 45 is disposed in the anchoring base 4, a resilient force in an axial direction can be employed to adjust the graphite electrode pillar 2 to bear a uniform loading.

Figure 7:
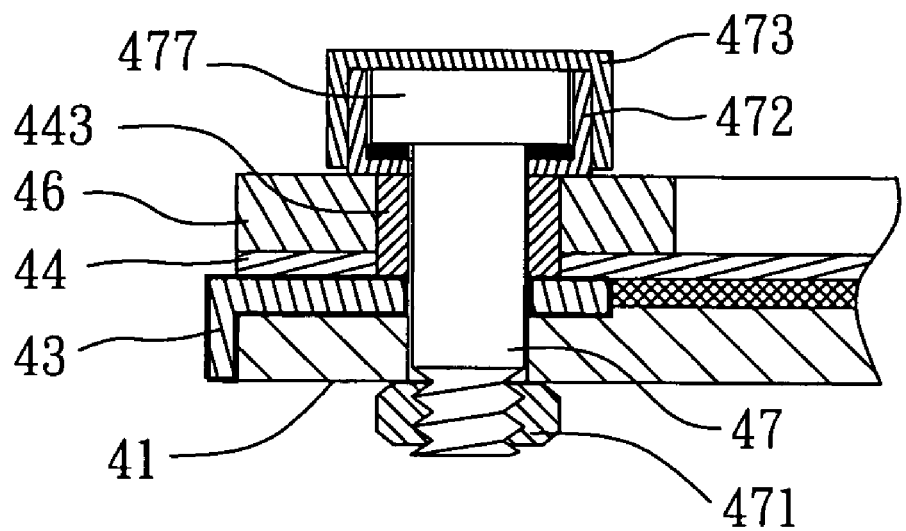
FIG. 7 is a cross-sectional view illustrating an electrode anchoring structure according to a third embodiment of the present invention.

Now referring to FIG. 7, a cross-sectional view illustrating an electrode anchoring structure according to a third embodiment of the present invention, this embodiment has a structure similar to that of the first embodiment, except that on the one hand, an insulating seat 472 and an insulating cap 473 cover, respectively, on head 477 of the bolt 47, and on the other, an insulating bush 443 sleeves on the bolt 47 and passes through the fixing ring 46 and the sealing washer 44. The insulating bush 443, at one end, seals on the insulating pad 43 and, at other end, seals on the insulating seat 472 so as to achieve a desirable insulation.

Figure 8:
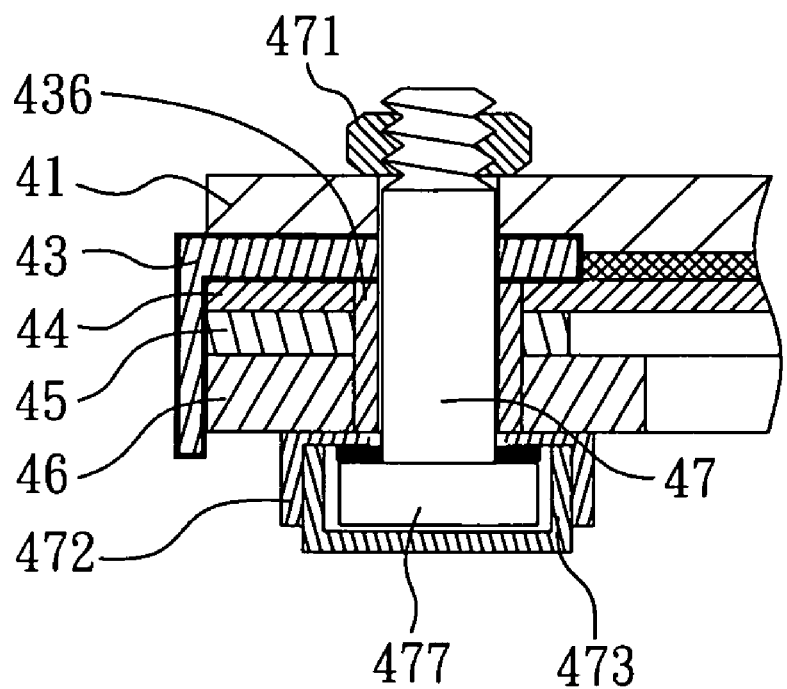
FIG. 8 is a cross-sectional view illustrating an electrode anchoring structure according to a fourth embodiment of the present invention.

Further, referring to FIG. 8, a cross-sectional view illustrating an electrode anchoring structure according to a fourth embodiment of the present invention, this embodiment has a structure similar to that of the second embodiment, except that on the one hand, the nut 471 of the bolt 47 secures the fixing ring 46 and the insulating seat 472 and the insulating cap 473 cover, respectively, on the head 477 of the bolt 47, and on the other, an insulating bush 436 sleeves on the bolt 47 and passes through the fixing ring 46, the resilient washer 45, and the sealing washer 44. The insulating bush 436, at one end, seals on the insulating pad 43 and, at other end, seals on the insulating seat 472 so as to achieve a desirable insulation.

Although the present invention has been explained in relation to its preferred embodiments, it is to be understood that many other possible modifications and variations can be made without departing from the scope of the invention as hereinafter claimed.

What is claimed is:

1. An electrode anchoring structure in a crystal-growing furnace, comprising:
   a graphite electrode pillar, being, at one end, provided with an external thread;
   a metal electrode pillar, including a nut base and an external screw, wherein the nut base is, at one end, provided with an internal thread hole so as to be engaged with the external thread of the graphite electrode pillar, and the nut base extends, from other end, the external screw, such that a shoulder is formed between the nut base and the external screw;
   an anchoring base, including a flange, an insulating sleeve, an insulating ring, a sealing washer, a fixing ring, a plurality of insulating rings and of bolts, wherein the flange includes a cylindrical portion and an annular portion, the cylindrical portion has a central hollow portion and the annular portion is provided with a plurality of through holes, the insulating sleeve receives the nut base of the metal electrode pillar, and which are then received together in the central hollow portion, the insulating pad has a center through hole and there are plural circular holes provided around the insulating pad, and wherein the external screw of the metal electrode pillar extends through the central hole of the sealing washer, such that the shoulder abuts upon the sealing washer, and the fixing ring is provided, circumferentially, with a plurality of fixing holes, and wherein the plural bolts extend, correspondingly, through the plural fixing holes of the fixing ring, the plural insulating rings, the plural releasing holes of the sealing washer, the plural circular holes of the insulating pad, the plural through holes of the flange, and are engaged tightly with plural nuts so as to secure together the insulating ring and the sealing washer in between the flange and the fixing ring, and wherein the flange and the sealing washer are electrically insulated from each other because they are spaced apart by the insulating sleeve, the insulating pad, and the plural insulating rings; and a locking nut, being engaged with the external screw of the metal electrode pillar so as to secure the sealing washer in between the locking nut and the shoulder of the metal electrode pillar.

2. The electrode anchoring structure in a crystal-growing furnace as claimed in claim 1, wherein the graphite electrode pillar is, at other end, electrically connected with a heater arranged inside the furnace.

3. The electrode anchoring structure in a crystal-growing furnace as claimed in claim 2, wherein the graphite electrode pillar is, at the other end, provided with an external thread, and the heater inside the furnace is provided with an upper nut and a lower nut, and the upper and lower nuts of the heater are engaged with the external thread such that an electrical connection can be established, correspondingly.

4. The electrode anchoring structure in a crystal-growing furnace as claimed in claim 2, wherein the graphite electrode pillar is, at the other end, provided with an external thread; and wherein the graphite electrode pillar further includes an upper adjusting nut and a lower adjusting nut, and through engagement of the adjusting nuts with the external thread of the graphite electrode pillar, the heater in the furnace can be supported.

5. The electrode anchoring structure in a crystal-growing furnace as claimed in claim 4, wherein both the upper adjusting nut and the lower adjusting nut are made of graphite.

6. The electrode anchoring structure in a crystal-growing furnace as claimed in claim 5, further comprising an insulating cap for covering the upper adjusting nut.

7. The electrode anchoring structure in a crystal-growing furnace as claimed in claim 1, wherein the metal electrode pillar is a copper electrode pillar.

8. The electrode anchoring structure in a crystal-growing furnace as claimed in claim 1, wherein the external screw of the copper electrode pillar is, at one end, electrically connected with an outside electric power source.

9. The electrode anchoring structure in a crystal-growing furnace crystal-growing furnace as claimed in claim 1, wherein the anchoring base includes a resilient washer interposed between the sealing washer and the fixing ring so as to provide a resilient force in an axial direction.

10. The electrode anchoring structure in a crystal-growing furnace as claimed in claim 9, wherein the resilient washer has a center portion, an annular portion, and at least one resilient portion, and wherein the at least one resilient portion is located in between the center portion and the annular portion, and the center portion is provided with a central hole, and the annular portion provided with a plurality of holes.

11. The electrode anchoring structure in a crystal-growing furnace as claimed in claim 1, wherein the flange is provided with an annular protrusion, and the insulating ring provided with an annular recess, such that the annular protrusion can be inserted into the annular recess.

12. The electrode anchoring structure in a crystal-growing furnace as claimed in claim 1, wherein an external edge is provided, circumferentially, at the insulating pad.

13. The electrode anchoring structure in a crystal-growing furnace as claimed in claim 1, wherein the sealing washer is made of copper.

14. The electrode anchoring structure in a crystal-growing furnace as claimed in claim 1, further comprising a plurality of insulating seats and of insulating caps covering, respectively, on heads the plural bolts.

* * * * *